(12) United States Patent
Wang

(10) Patent No.: US 6,455,910 B1
(45) Date of Patent: Sep. 24, 2002

(54) CROSS GUARD-RING STRUCTURE TO PROTECT THE CHIP CRACK IN LOW DIELECTRIC CONSTANT AND COPPER PROCESS

(75) Inventor: Mu-Chun Wang, Hsinchu Hsien (TW)

(73) Assignee: United Microelectronic Corp., Hsicnhu (TW)

( * ) Notice: Subject to any disclaimer, the term of this patent is extended or adjusted under 35 U.S.C. 154(b) by 0 days.

(21) Appl. No.: 09/835,012

(22) Filed: Apr. 13, 2001

(30) Foreign Application Priority Data

Apr. 10, 2001 (TW) .......................................... 90108503

(51) Int. Cl.⁷ ........................ H01L 27/095; H01L 29/47
(52) U.S. Cl. ...................... 257/484; 257/170; 257/409; 257/452; 257/605; 257/774
(58) Field of Search ................................ 257/127, 170, 257/409, 452, 484, 605, 773, 774

(56) References Cited

U.S. PATENT DOCUMENTS 5,266,831 A * 11/1993 Phipps et al. ............... 257/620
5,274,263 A * 12/1993 Wadsworth .................. 257/409
5,838,050 A * 11/1998 Ker et al. .................... 257/401
6,160,303 A * 12/2000 Fattaruso ..................... 257/531

FOREIGN PATENT DOCUMENTS

JP 1-227473 A * 9/1989 .................. 257/484

* cited by examiner

Primary Examiner—Eddie Lee
Assistant Examiner—Matthew E. Warren
(74) Attorney, Agent, or Firm—J. C. Patents

(57) ABSTRACT

A structure of a cross guard ring along the edge of a semiconductor chip is disclosed. A first guard ring, a second guard ring and a third guard ring are formed along the edge of a semiconductor chip. Each guard ring comprises several rectangle shaped vias which are positioned along the edge of the chip structure, wherein each rectangle via is separated from an adjacent rectangle via by a gap. Further, each rectangle via of the second guard ring is positioned opposite the said gap of the first guard ring and are crossed over and have some overlay with rectangle vias of the first guard ring which are separated by the said gap as shown in FIG. 2. Similarly the third guard ring is positioned with respect to the second guard ring.

11 Claims, 1 Drawing Sheet

CROSS GUARD-RING STRUCTURE TO PROTECT THE CHIP CRACK IN LOW DIELECTRIC CONSTANT AND COPPER PROCESS

CROSS-REFERENCE TO RELATED APPLICATIONS

This application claims the priority benefit of Taiwan application Ser. No. 90108503, filed on Apr. 10, 2001.

BACKGROUND OF THE INVENTION

1. Filed of Invention

The present invention relates generally to semiconductor and more specifically to a cross guard-ring structure.

2. Description of Related Art

Integrated circuits are manufactured as assemblies of the various devices, such as transistors that make up a chip and many chips are included on a single wafer. In the process of manufacturing integrated circuits, after the individual devices, such as the transistors, have been fabricated in the silicon substrate, they must be connected together and packaged onto the suitable circuit board to perform the desired circuit functions. However one problem is the moisture induced chip cracking often occurs during the packaging process. During the packaging process, for example during the reflow soldering process, the chip is exposed to a higher temperature of about 215–260° C. As a result the moisture from the ambient will concentrate on the boundary surface between the chip pad and molding resin and flashes into steam under the high temperature. Because the adhesion there is usually poor and also because the plastic section over and under the chip/lead frame surfaces are very thin, the steam pressure is sufficient to rupture the thinner packages. As a result, cracking of the chip occurs. Consequently, moisture will penetrate into the chip and if the internal circuitry of the chip are unprotected from moisture, the moisture would corrode the wiring and interconnect structures. As a result the resistance of the wiring structure increases. Because the resistance is increased, the RC delay time is therefore increased, therefore the operating speed is reduced. Eventually the functionality of the device ceases.

Presently in IC manufacturing, the wiring in chip level interconnects and the device itself are normally protected from moisture by various layers of inorganic dielectrics consisting of oxides or nitrides such as silicon nitride and/or silicon oxide. In addition to being effective as moisture barrier layers, inorganic dielectrics are also excellent barriers against the migration of ions which can be present as contaminants or in processing fluids such as etching solutions. Such ions may corrode the metal wiring as well as migrate to the semiconductor itself wherein the migrating ions may form fast moving silicides which essentially destroy the semiconductor device.

Recently, organic dielectric materials such as polyimides, polybenzocyclobutanes (BCBs) and poly(arylene ethers) have drawn considerable interest for their low dielectric constant properties thus reduce signal delays. But one problem is that they are hygroscopic so they tend to be permeable to moisture and other contaminants. This permeability problem is particularly detrimental to Cu wiring which can oxidize in the presence of moisture. In addition, ions such as iron, copper, sodium, and/or potassium ions among others can corrode the Cu wiring. Furthermore, ions such as iron and copper can potentially migrate to the semiconductor where they form fast moving suicides which may destroy the device. One scheme is to use the inorganic dielectric materials such as silicon oxide and silicon nitride material as barrier layers in order to protect the organic dielectric material from moisture and other contaminants. However one problem with the inorganic and organic dielectric materials is that they are very fragile. The fragileness is the main problem because of the thermal stress caused due to the packaging process as described above, can easily crack the said dielectric layers and thus chip crack occurs. As a result, moisture and other contaminants can easily penetrate through the crack lines into the chip and may destroy the device.

In view of the drawbacks mentioned hereinabove it is therefore highly desirable to provide a protective structure which can effectively prevent the chip crack so that moisture and/or ions can be effectively prevented from penetrating to the Cu wiring of such IC interconnect structures. Thus the reliability of the device can be enhanced.

SUMMARY OF THE INVENTION

The present invention provides a cross guard ring structure which serves to protect the chip from cracking so that penetration of moisture into the chip can be effectively prevented. Therefore the reliability of the device can be enhanced.

The present invention provides a cross guard ring structure along the edge of a semiconductor chip structure so that the chip structure is protected from chip crack during the packaging process.

The present invention provides a cross guard ring structure so that the above objectives and other objects are met.

These and other objects and advantages are achieved in the present invention by placing guard rings along the edge of an IC chip so that the chip can be effectively protected from cracking due to thermal stress which is induced due to the packaging process.

Specifically, the present invention provides a cross guard ring structure. A first guard ring, a second guard ring and a third guard ring are formed and concentrically positioned along the edge of a semiconductor chip, as shown in FIG. 1. Each guard ring comprises several rectangle shaped copper vias which are positioned along the edge of the chip structure, wherein each copper via is separated from an adjacent copper via by a gap. Further, each copper via of the second guard ring is positioned opposite the said gap of the first guard ring and are crossed over and have some overlay with copper vias of the first guard ring which are separated by the said gap as shown in FIG. 2. Similarly the third guard ring is position with respect to the second guard ring. The first guard ring, the second guard ring and the third guard ring are separated from each other by a space.

It is to be understood by those skilled in the art that because the cross guard ring structure is positioned along the edge of a semiconductor chip, therefore chip crack due to thermal stress can be effectively prevented.

It is to be further understood by those skilled in the art that because chip crack can be effectively prevented by positioning a cross guard ring structure along the edge of a semiconductor chip, therefore moisture and other contaminants cannot penetrate into the chip which would otherwise corrode the wiring and interconnect structure present therein and destroy the functionality of the semiconductor chip. Thus the reliability of the semiconductor device can be substantially enhanced.

It is understood that the foregoing general description and the following detailed description are exemplary, but are not restrictive, of the present invention.

DESCRIPTION OF THE PREFERRED EMBODIMENTS

Figure 1:
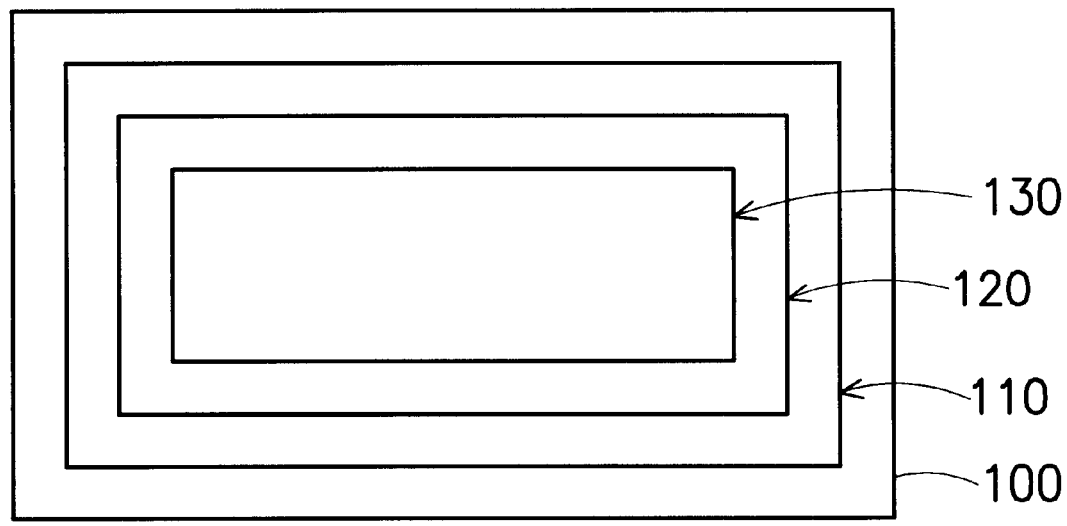
FIG. 1 is a schematic top view showing a structure of guard rings that are placed along the edge of a typical IC chip including vias and interconnect structures and organic dielectric inter-layers, in accordance with the present invention.

Reference will be made in detail to the present preferred embodiments of the invention, examples of which are illustrated in the accompanying drawings. Wherever possible, the same reference numbers are used in the drawings and the description to refer to the same or like parts.

It is to be understood that the foregoing general description and the following detailed description are exemplary, and are intended to provide further explanation of the invention as claimed.

Referring to FIG. 1, the present invention provides a cross guard ring structure comprising a first guard ring 110, a second guard ring 120 and a third guard ring 130 formed and concentrically positioned along the edge of a typical semiconductor chip 100. The first guard ring 110 is positioned in such a manner that it surrounds or encloses the second guard ring 120 and the third guard ring 130, wherein the second cross guard ring 120 surrounds or encloses the third cross guard ring 130. In other words, the first, the second and third cross guard rings 110, 120, and 130 are concentrically positioned along the edge of the semiconductor chip 100. The semiconductor chip 100 comprises at least an active device including a semiconductor substrate; an organic dielectric interconnect structure formed on the said substrate, wherein said organic dielectric interconnect structure contains metallic vias, lines and pads embedded in one or more layers, where said metallic pads serve to make contact with a next level package by means of solder balls, wire bonding or TAB connections. Such organic dielectric materials are permeable to moisture and ion migration; they are well known to those skilled in the art and include materials, such as, but not limited to: diamond like carbon (DLC), fluorinated DLC, sesquisiloxanes (HSSQ), methyl sesquisiloxanes (MSSQ), polyimides, parylene-N, benzocyclobutanes, fluorinated polyimides, poly(arylene ethers), parylene-F, Teflon AF, poly(naphthalenes), poly (norbonenes), foams of polyimides, xerogels, porous PTFE, and porous MSSQ. The lines, vias and pads are composed of conductive metals including, but not limited to: copper, tungsten, chromium, aluminum, silver, gold, platinum, and alloys thereof. Of these conductive metals, it is highly preferred that at least the majority of the metallic lines be composed of copper. Metals used for these conductive connections to the next level are well known to those skilled in the art and can be pure metals as well as metal alloys with or without lead. The connection is formed using techniques well known to those skilled in the art.

Figure 2:
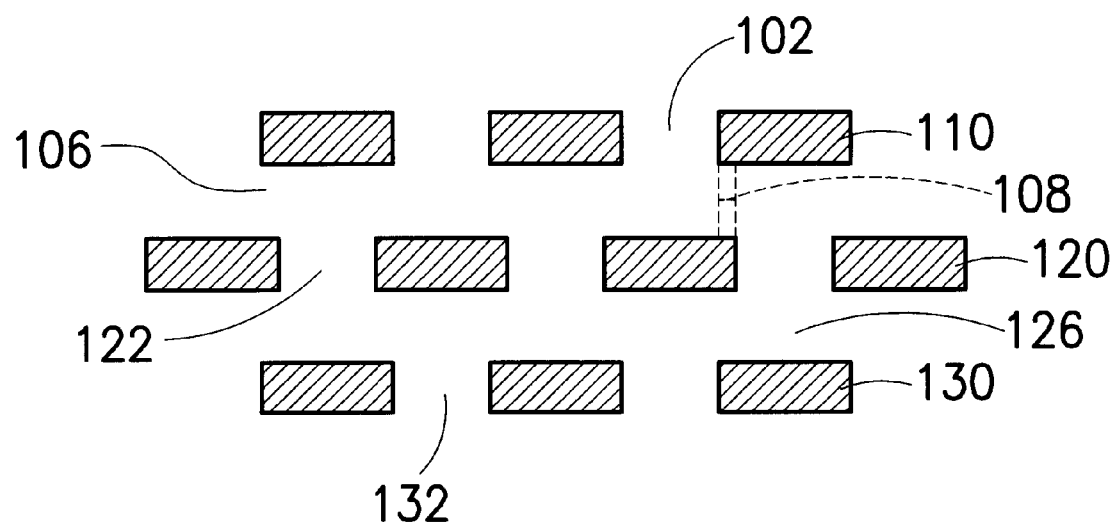
FIG. 2 is a schematic magnified cross-sectional top view of three guard rings structure comprising rectangle vias, showing arrangement or positioning of the rectangle vias in accordance with the present invention.

Referring to FIG. 2, the said first, second and third guard ring comprises of vias of any shape. Even though a rectangle shaped vias is preferable, however the shape of the vias may include other shapes such as a square, a triangle, a rhombus, an ellipsoid, an oval, a circle, a T, and a hexagonal. Preferably, the material of the via is selected from a group comprising copper, aluminum, tungsten, titanium, silver, gold, and alloys thereof.

Now, referring to only the first guard ring 110, each rectangle via is separated from an adjacent rectangle via by a gap 102, the gap width is preferably about 2–4 $\mu$m. This gap 102 can release some stress. Likewise the rectangle vias of the second guard 120 is similarly positioned with a gap 122, the gap width is preferably about 2–4 $\mu$m in between two adjacent rectangle vias. This gap 122 can release some stress. Similarly the rectangle vias of the third guard ring 130 are positioned with a gap 132, the gap width is preferably about 2–4 $\mu$m in between two adjacent rectangle vias. This gap 132 can release some stress.

The first guard ring 110 and the second guard ring 120 are separated by a space 106, the space width is preferably about 2–4 $\mu$m. Similarly, the second guard ring 120 and the third guard rung 130 are separated by a space 126, the space width is preferably about 2–4 $\mu$m. These spaces 106, and 126 can release some stress.

Preferably, each copper via has a dimension with a length of about 6–10 $\mu$m, preferably 8 $\mu$m and a width of about 0.5–1 $\mu$m. Preferably, the length profile of each rectangle via is positioned parallel to the chip 100. Further, each rectangle via of the second guard ring 120 is positioned opposite the said gap 102 of the first guard ring 110 and are crossed over and have some overlay 108 with rectangle vias of the first guard ring 110 which are separated by the said gap 102 as shown in FIG. 2. Similarly the third guard ring 130 is position with respect to the second guard ring 120.

In the event a crack occurs due to a thermal stress, the crack line can extend only up to the rectangle via, because the rectangle via is much stronger it is not cracked, thus the rectangle via can effectively resist the crack. And in the event when a crack occurs in the gap 102 in between two adjacent rectangle vias of the first guard ring, since a rectangle via of the second guard ring 120 is positioned opposite the said gap 102 and partly overlays the rectangle vias of the first guard ring 110, as a result, the crack line can extend only up to the copper via of the second guard ring 120 and similarly, the crack line cannot extend beyond the copper via of the second guard ring 120. Therefore, the cross guard rings effectively resist the cracking of the chip 100. Because the crack line cannot extend beyond the copper vias of the cross guard ring structure, the internal circuitry of the chip 100 can be well protected from cracking. Thus moisture and other contaminants cannot penetrate into the chip 100 which would otherwise destroy the device.

It should be understood that cross guard ring structure is fabricated using techniques well known to those skilled in the art. The great advantage of fabricating the guard ring structure of the present invention is, and also as it will be understood by those skilled in the art that it can be fabricated simultaneously during the fabrication of the semiconductor chip and requires no extra process step. Therefore the production through-put is unaffected.

As stated above, the cross guard ring structure prevents moisture and/or ions from penetrating into the final IC interconnect structure. The moisture prevention is exemplified by the fact that IC structures containing the cross guard ring structure exhibit no water uptake. Ion migration prevention is manifested by the fact that the Cu wiring does not significantly corrode upon extended use of the IC structure.

The above preferred embodiment is given to illustrate the scope and spirit of the present invention. Because this is given for illustrative purposes only, the invention embodied therein should not be limited thereto.

While the best mode utilizes copper as the material for constructing the cross guard ring structure, it should be understood that other materials such as aluminum, silver, gold, tantalum, titanium, tungsten and alloys thereof may be used to practice the present invention.

While the best mode utilizes a rectangular shaped via for constructing the cross guard ring structure, it should be understood that any other shaped vias may be used to practice the present invention.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

It is to be understood that the foregoing general description and the following detailed description are exemplary, and are intended to provide further explanation of the invention as claimed.

What is claimed is:

1. A cross guard ring structure formed along an edge of a semiconductor chip, the structure comprising:
   a first guard ring;
   a second guard ring adjacent to the first guard ring; and
   a third guard ring adjacent to the second guard ring, wherein the first guard ring, the second guard ring and the third guard ring are positioned on a same plane and concentrically along the edge of the semiconductor chip with the first guard ring separated from the adjacent second guard ring with a first space and the second guard ring separated from the adjacent third guard ring with a second space, and the first guard ring, the second guard ring and the third guard ring, each comprises a plurality of vias, wherein each via of each guard ring is separated from an adjacent via of the same guard ring by a gap and the gaps between the vias of the same guard ring are positioned directly across from the vias of the adjacent guard ring.

2. The structure according to claim 1, wherein the material of the vias is selected from a group consisting of copper, aluminum, silver, gold, tantalum, titanium, tungsten and alloys thereof.

3. The structure according to claim 1, wherein the shape of the vias include a rectangle, a square, a triangle, a rhombus, an oval, a circle, an ellipsoid, a T, and a hexagonal.

4. The structure according to claim 3, wherein the dimension of the rectangle via includes a length of about 6–10 μm, and a width of about 0.5–2 μm.

5. The structure according to claim 3, wherein the length profile of the rectangle vias is positioned parallel to the semiconductor chip.

6. The structure according to claim 1, wherein the width of said gap is about 2–4 μm.

7. The structure according to claim 1, wherein the each via of each guard ring is at least partially overlapping with two adjacent vias of the adjacent guard ring.

8. The structure according to claim 1, wherein the width of the first space is about 2–4 μm.

9. The structure according to claim 1, wherein the second guard ring is separated from the third guard ring by a space, wherein the width of the second space is about 2–4 μm.

10. The structure according to claim 1, wherein the semiconductor chip comprises at least one dielectric interconnect structure, wherein the dielectric interconnect structure includes at least one dielectric layer having one or more layers of metallic vias, lines and pads embedded therein, said metallic vias, lines and pads are composed of a conductive metal selective from the group consisting of copper, tungsten, chromium, aluminum, silver, gold, platinum, and alloys thereof, wherein said metallic pads are used for connection to a next level package bonding.

11. The structure according to claim 9, wherein the material of the dielectric layer is selected from a group consisting of carbon (DLC), fluorinated DLC, sesquisiloxanes (HSSQ), methyl sesquisiloxanes (MSSQ), polyimides, parylene-N, benzocyclobutanes, fluorinated polyimides, poly(arylene ethers), parylene-F, Teflon AF, poly (naphthalenes), poly(norbonenes), foams of polyimides, xerogels, porous PTFE, and porous MSSQ.

* * * * *